United States Patent [19]
Curchod

[11] Patent Number: 5,255,666
[45] Date of Patent: * Oct. 26, 1993

[54] SOLAR ELECTRIC CONVERSION UNIT AND SYSTEM

[76] Inventor: Donald B. Curchod, 234 Eleanor Dr., Woodside, Calif. 94062

[*] Notice: The portion of the term of this patent subsequent to Nov. 28, 2007 has been disclaimed.

[21] Appl. No.: 257,506

[22] Filed: Oct. 13, 1988

[51] Int. Cl.$^5$ .............. F24J 3/02; F24J 2/08; F24J 3/00
[52] U.S. Cl. ............... 126/569; 126/600; 126/698; 126/909; 126/440; 126/425; 136/243; 136/246; 136/248; 359/742; 359/726; 350/167
[58] Field of Search ........... 126/440, 417, 425, 450, 126/569, 600, 605, 684, 692, 698, 909; 136/246, 247; 350/167, 436, 447, 574; 359/742, 743, 726, 727

[56] References Cited

U.S. PATENT DOCUMENTS

| | | | |
|---|---|---|---|
| 4,022,186 | 5/1977 | Northrup, Jr. | 126/440 |
| 4,069,812 | 1/1978 | O'Neill | 126/440 X |
| 4,307,710 | 12/1981 | Natter | 126/440 |
| 4,307,711 | 12/1981 | Doundoulakis | 126/600 X |
| 4,337,759 | 7/1982 | Poporich et al. | 126/440 X |
| 4,395,582 | 7/1983 | Damsker | 126/569 X |
| 4,723,535 | 2/1988 | Lew | 126/440 X |
| 4,771,764 | 9/1988 | Cluff | 126/440 |

Primary Examiner—Larry Jones
Attorney, Agent, or Firm—Baylor G. Riddell

[57] ABSTRACT

A solar electric conversion unit and system includes substantially increased efficiency with reduced losses and increased acceptance angles. The system employs a short focal length fresnel lens extruded to further include depending side walls. The free edges of the sides carry a heat sink supporting a photovoltaic cell. The extruded side walls function as light pipes for carrying light directly to the photovoltaic cell. The walls are reflective inwardly of the unit to further avoid loss of stray light.

36 Claims, 14 Drawing Sheets

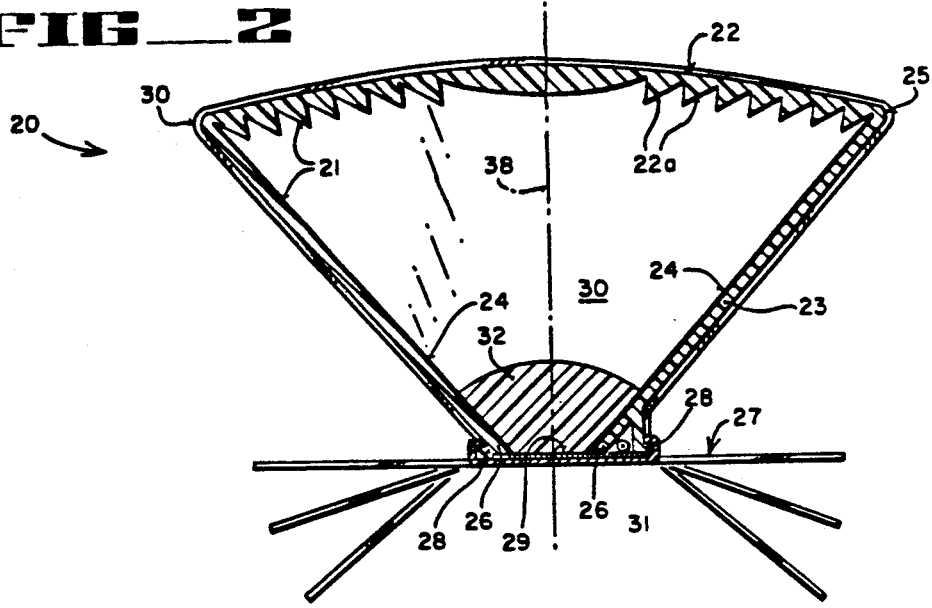
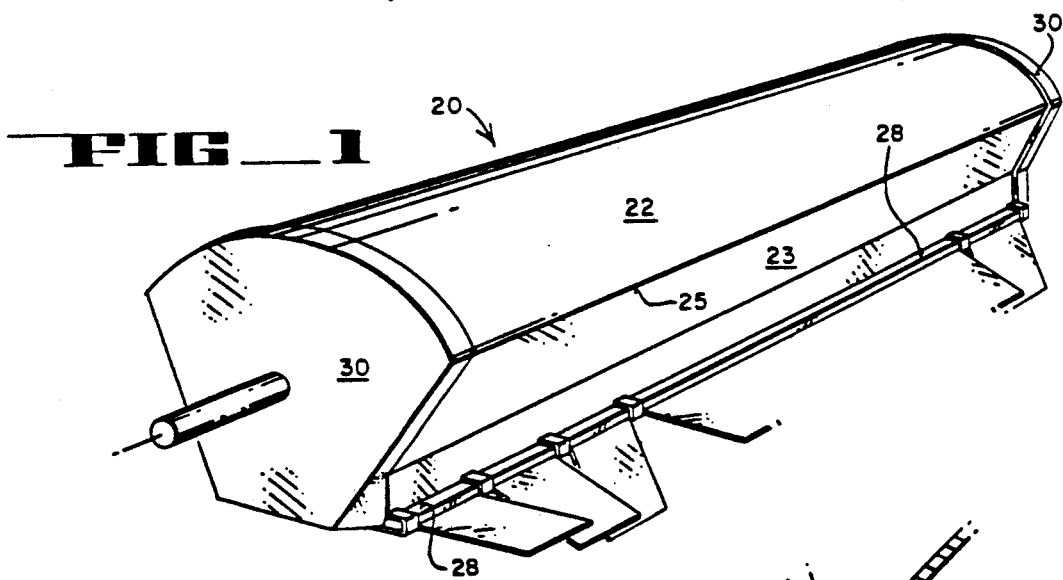
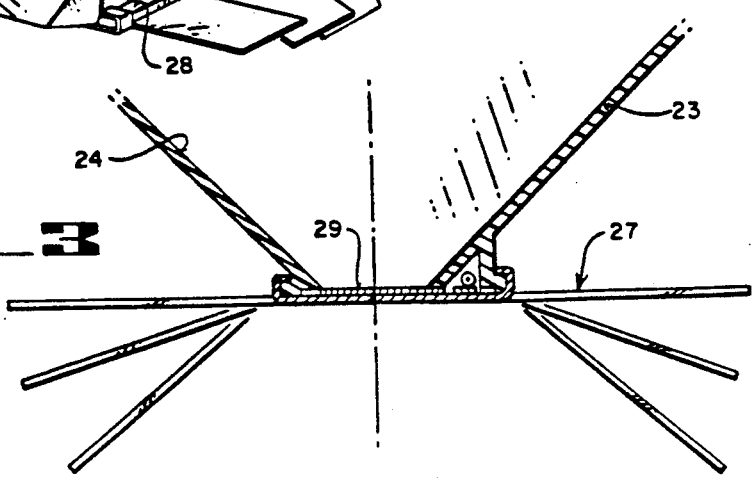

FIG_4
TRACKING ERROR OF ∅ DEGRESS
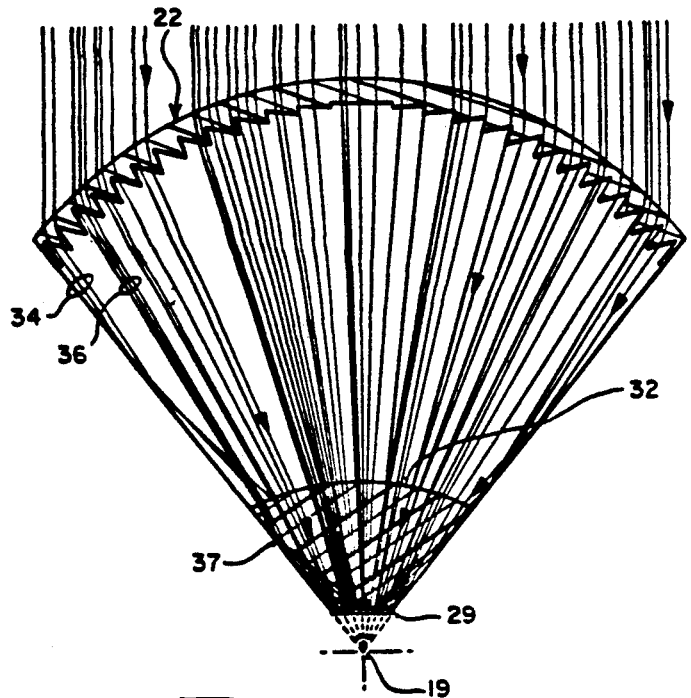
FIG_5
CLOSE-UP OF SECONDARY
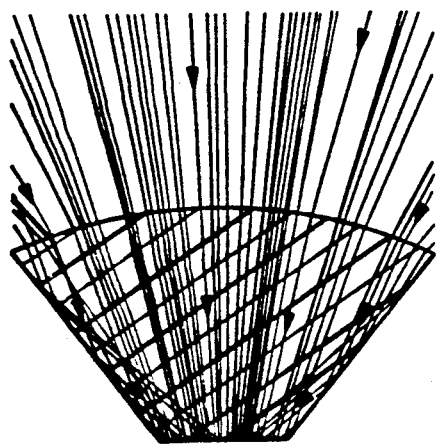

FIG_6
TRACKING ERROR OF 5 DEGRESS
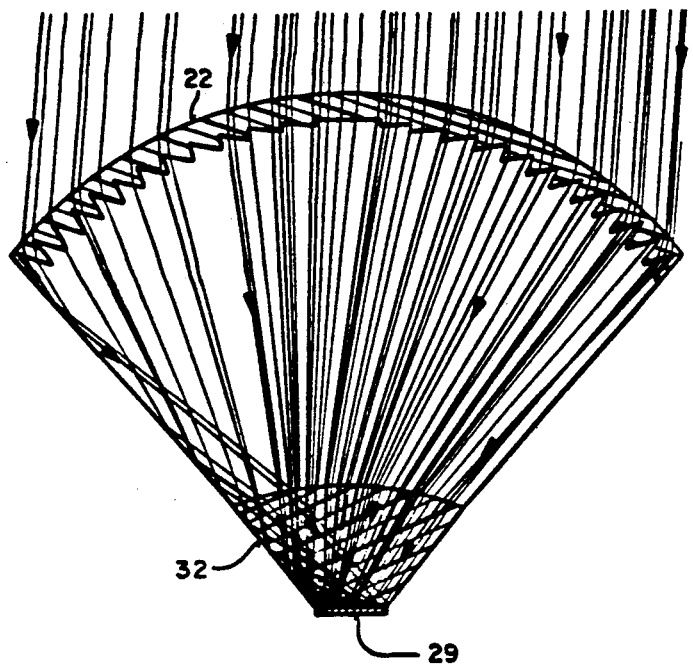
FIG_7
CLOSE-UP OF SECONDARY
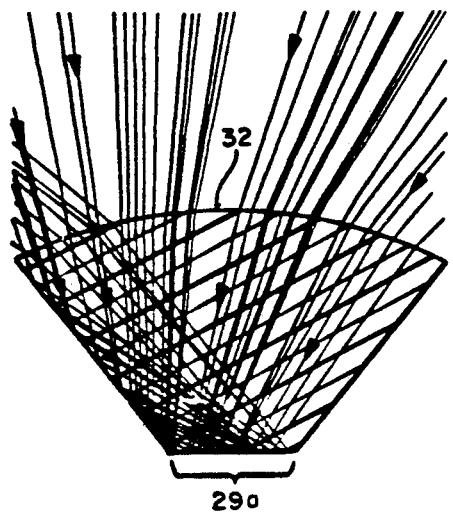

FIG_8 (PRIOR ART)

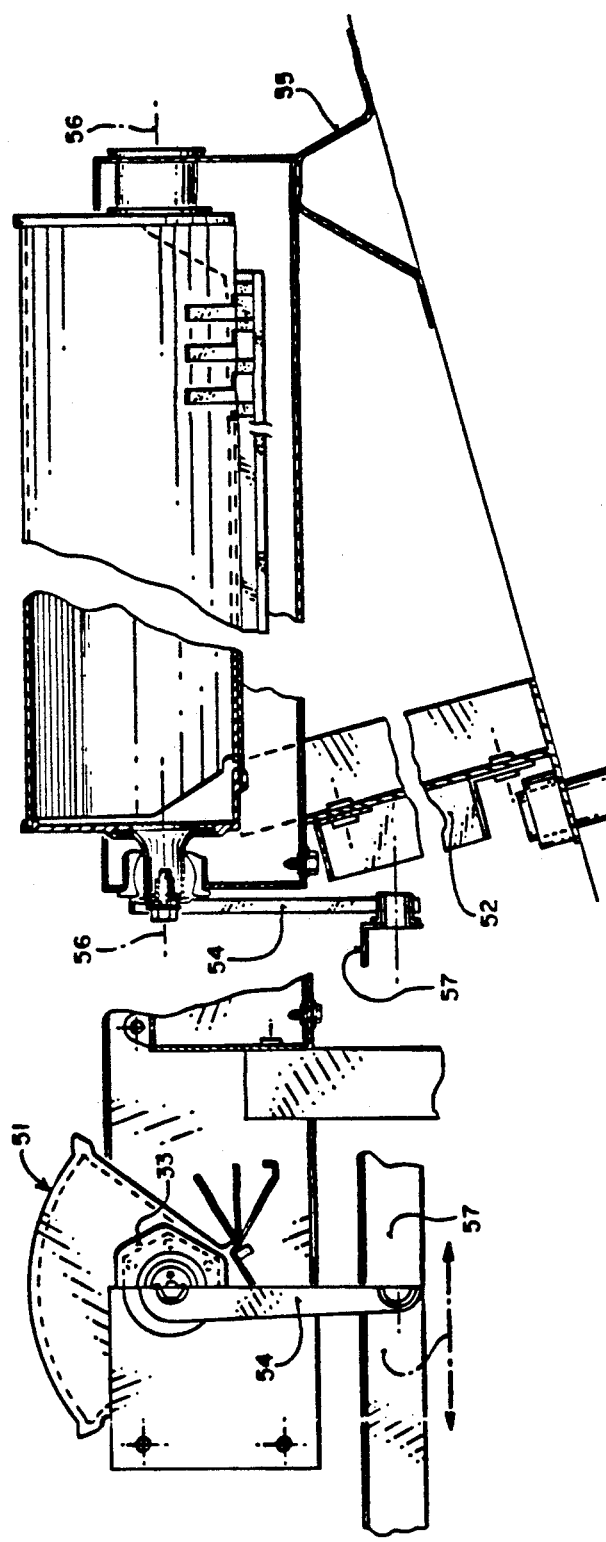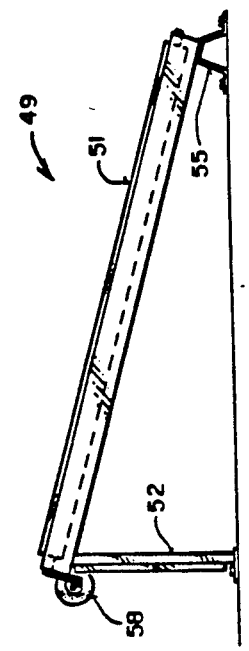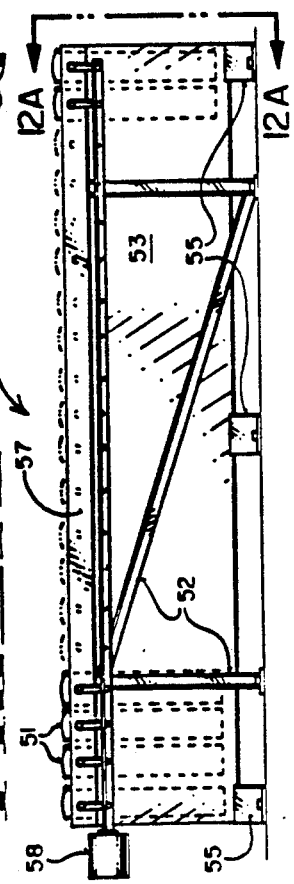

FIG_13
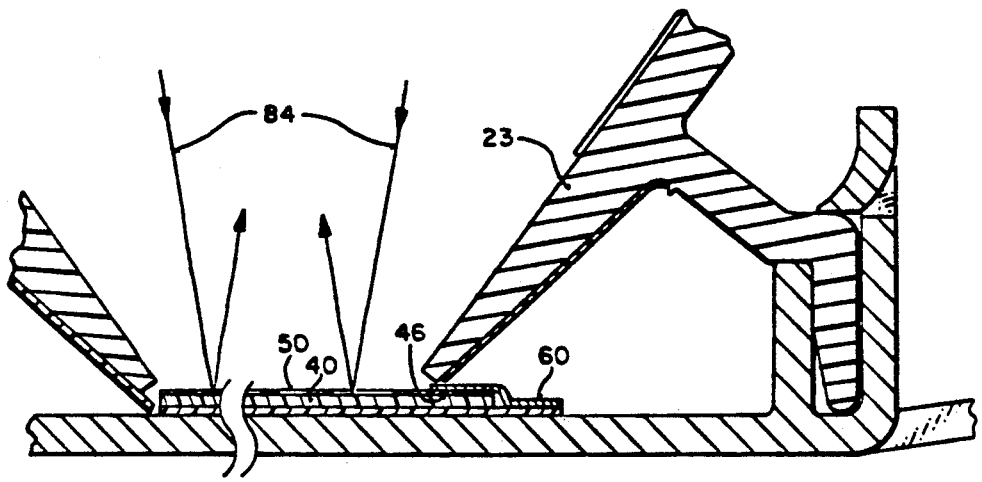
FIG_14
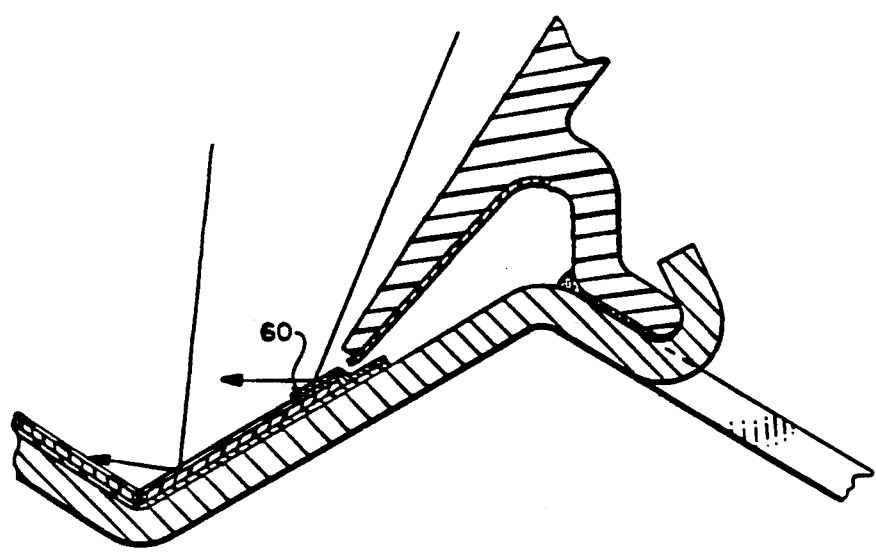

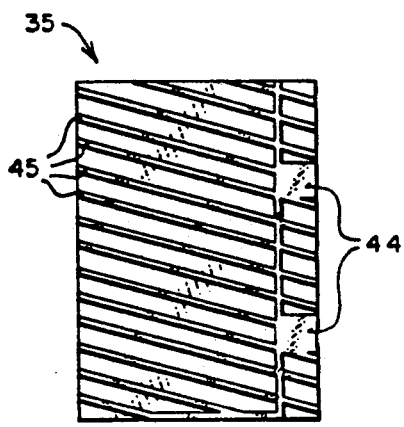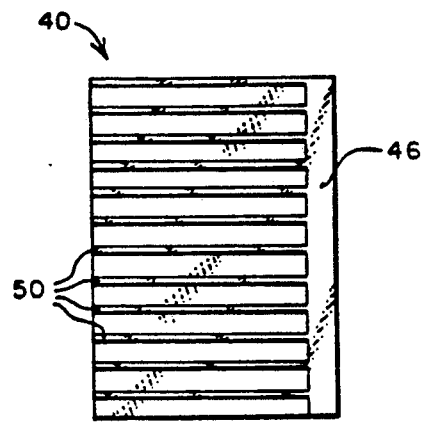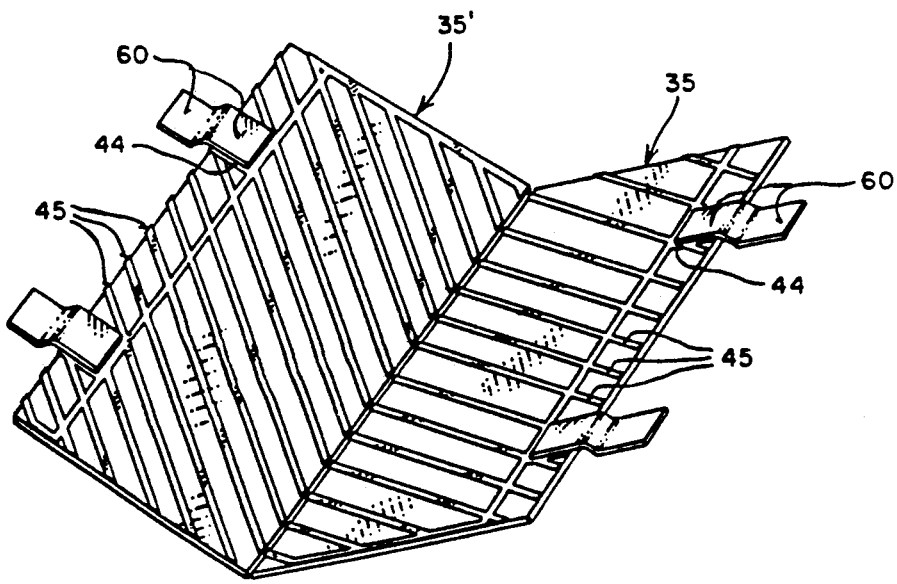

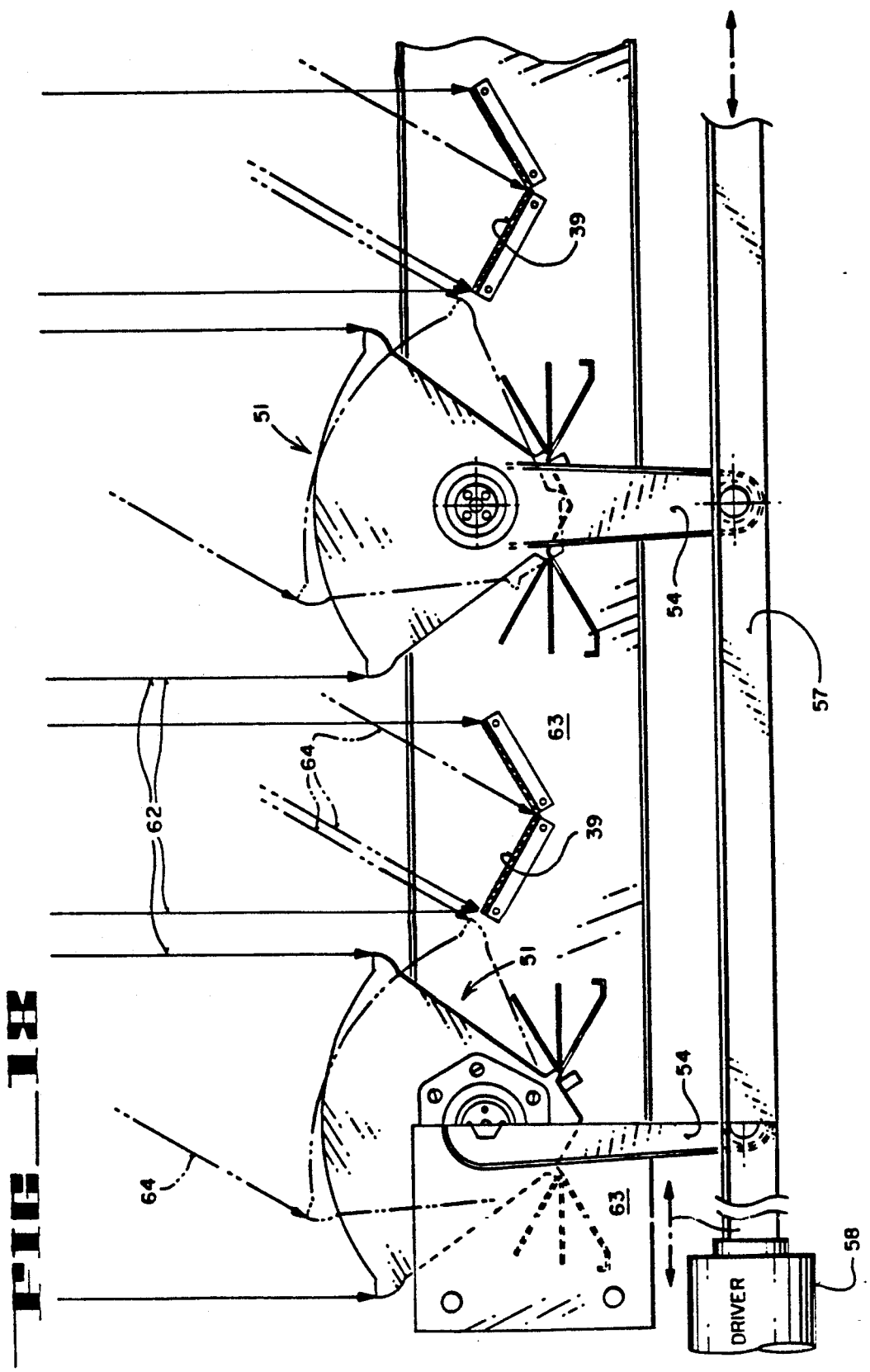

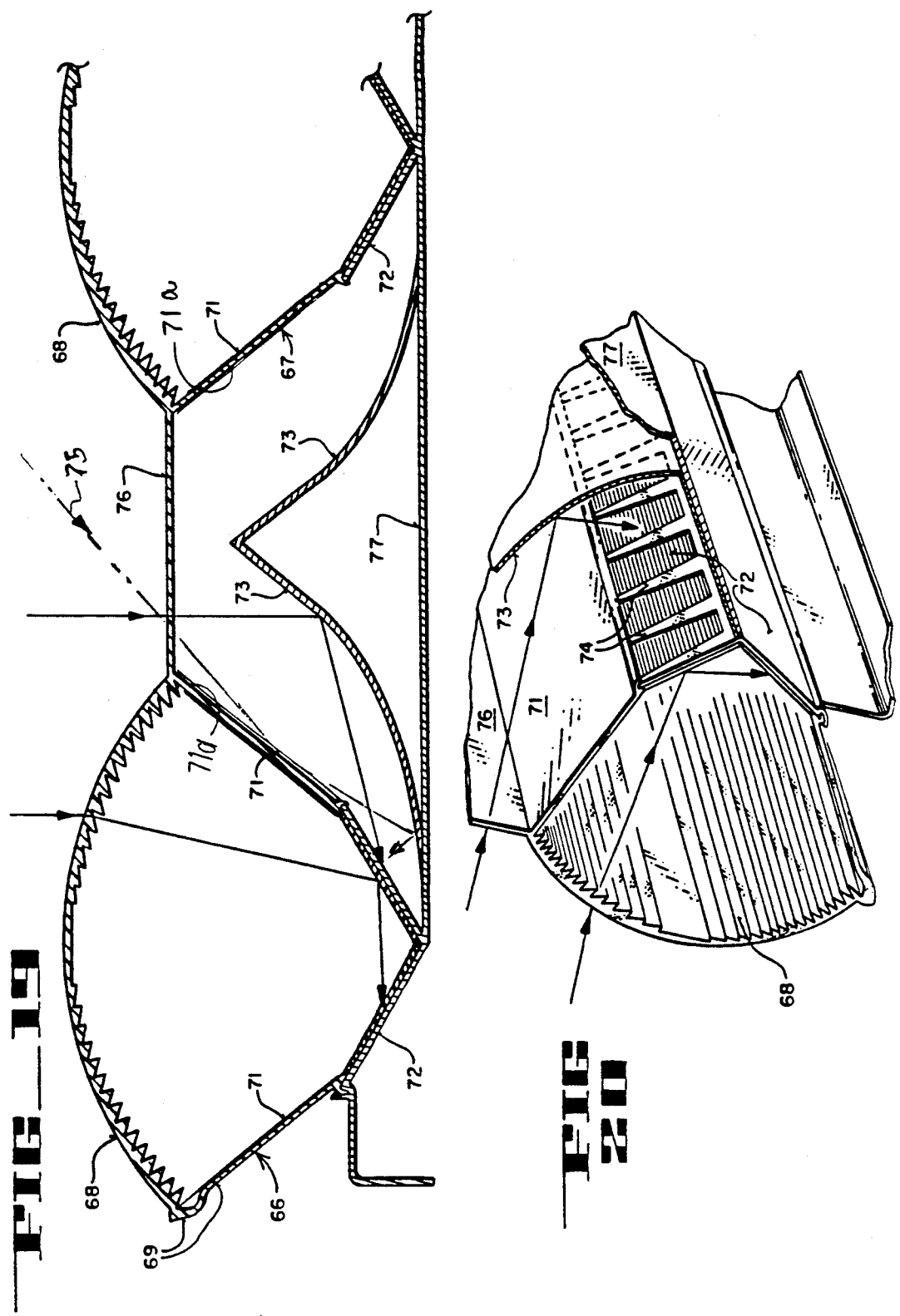

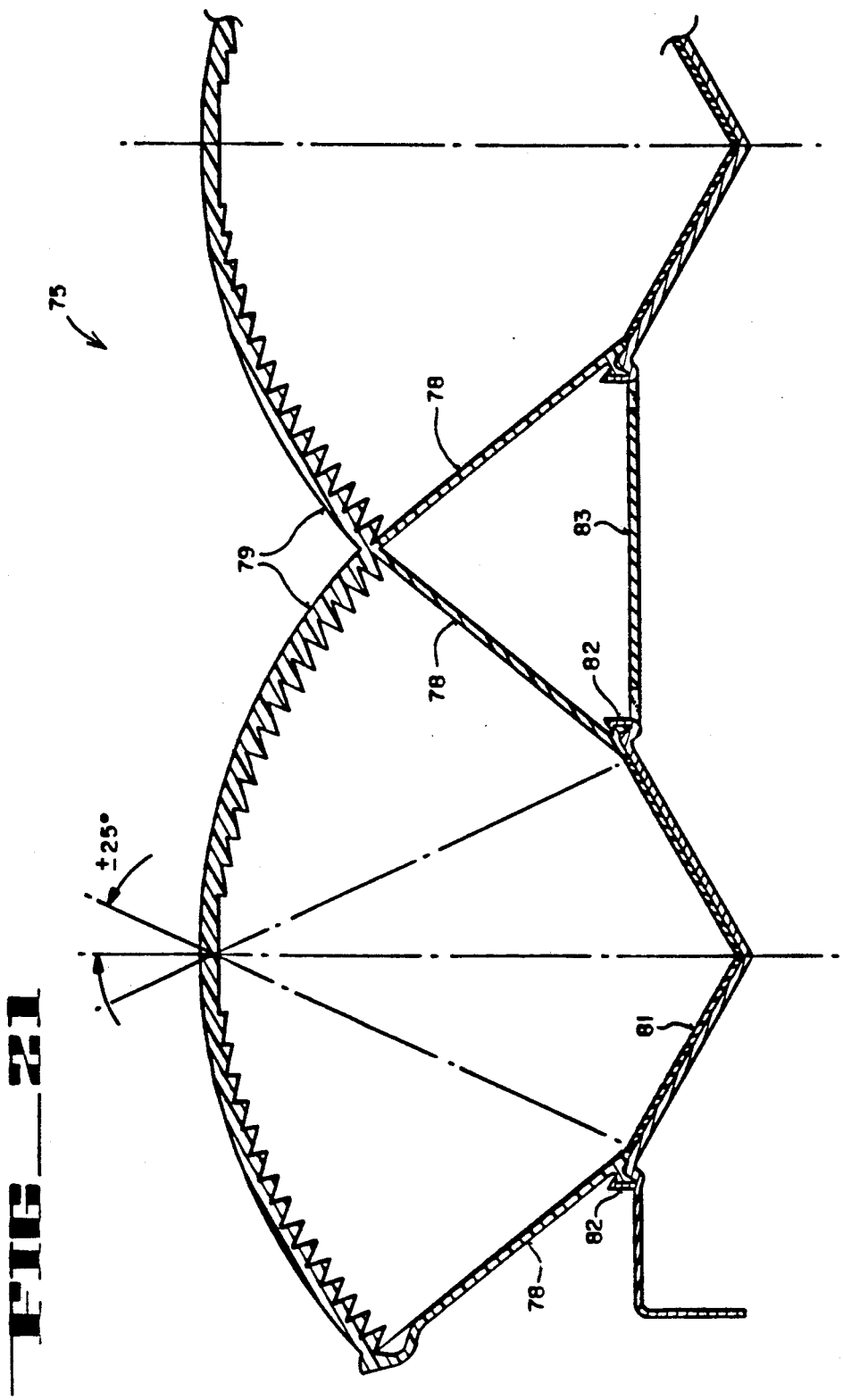
FIG_21

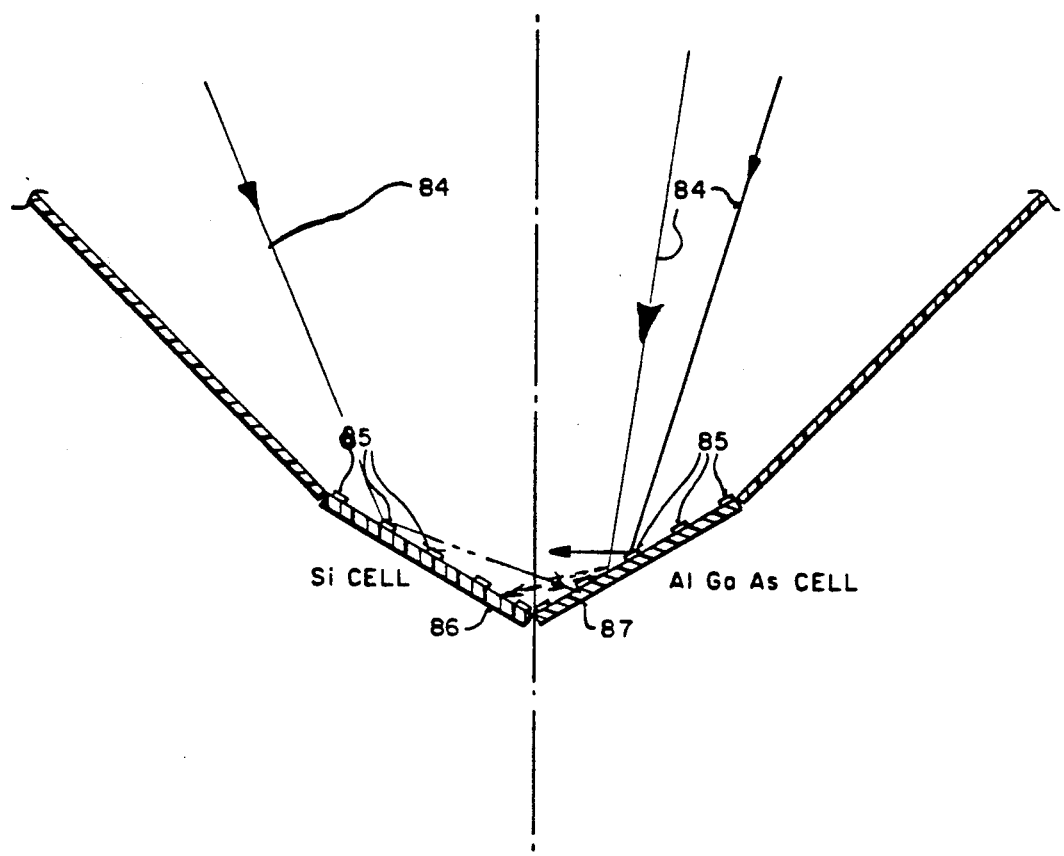
FIG__22

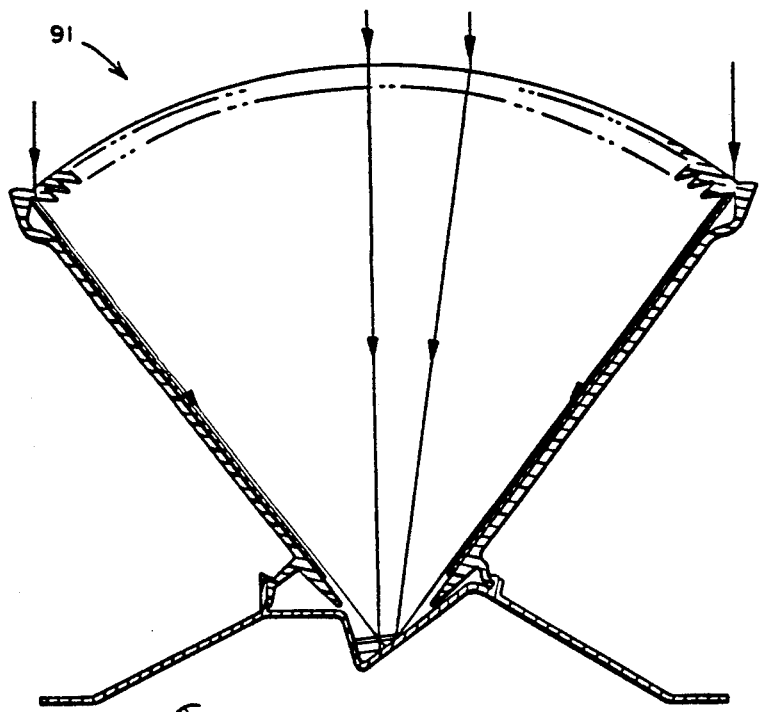
FIG_23
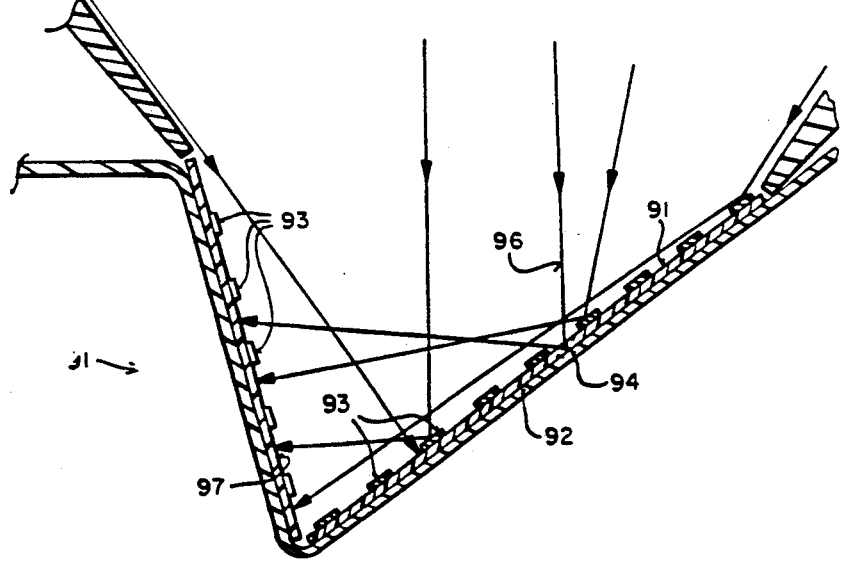
FIG_24

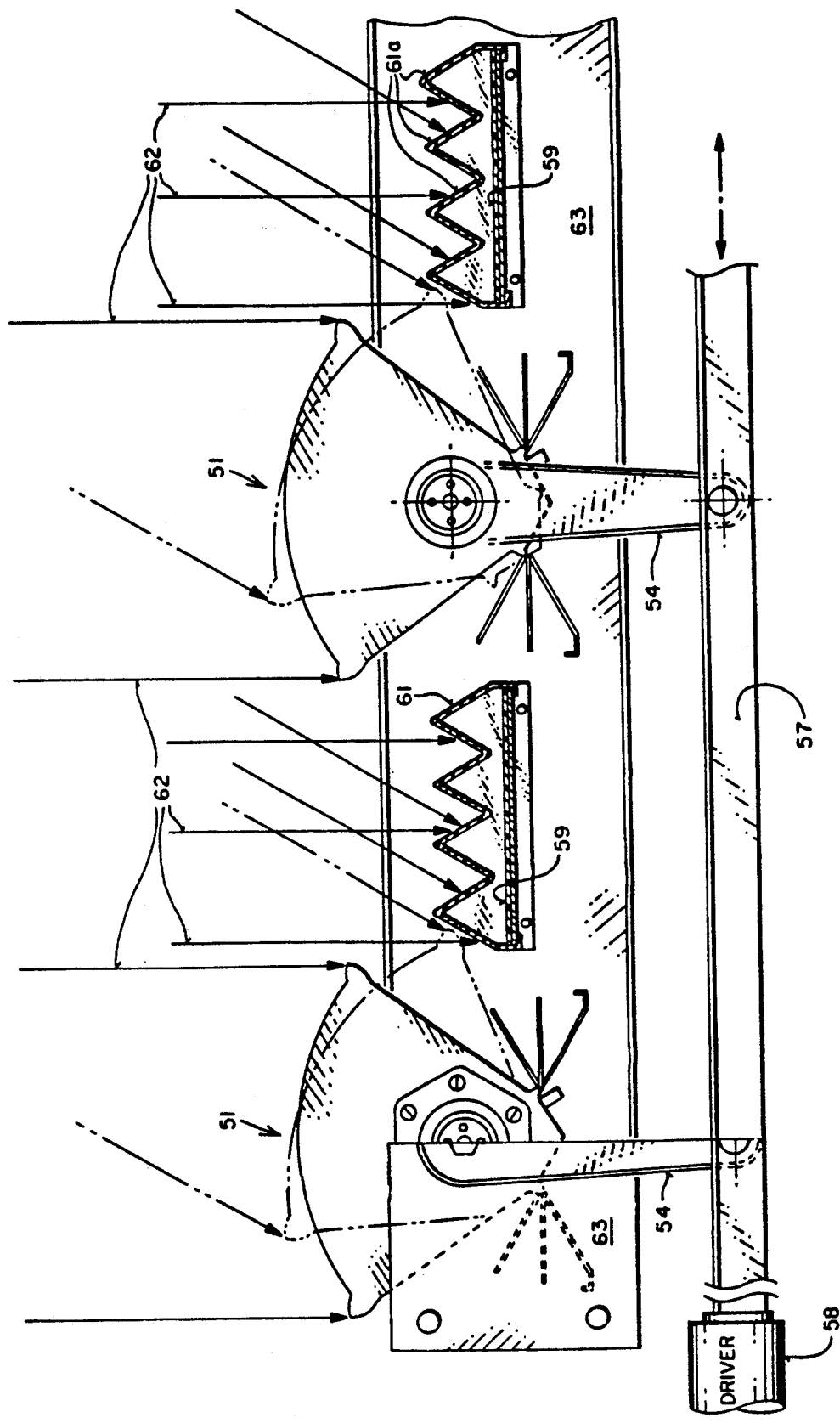

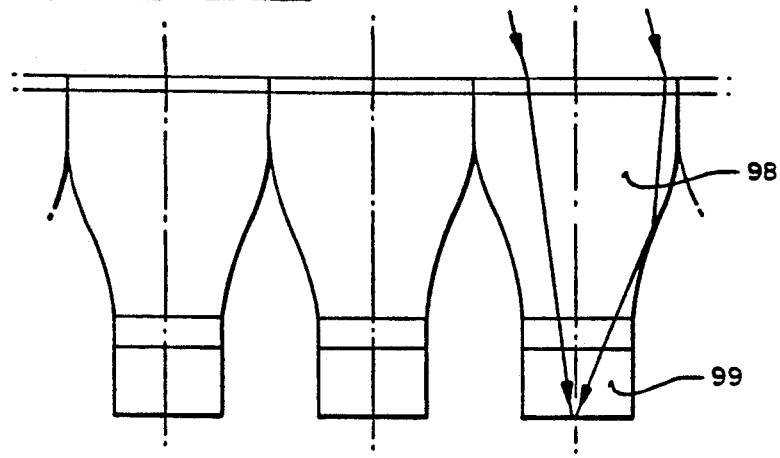
FIG_26
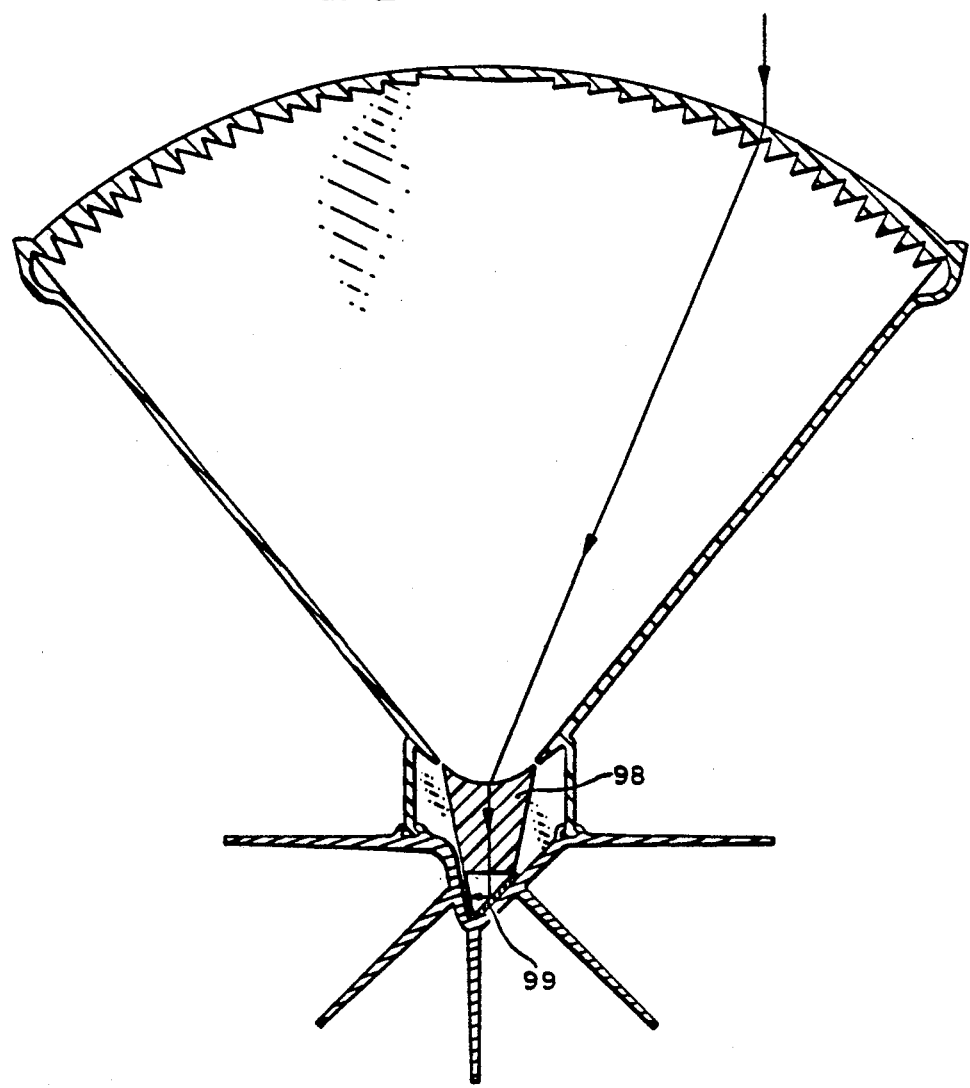
FIG_27

SOLAR ELECTRIC CONVERSION UNIT AND SYSTEM

This invention pertains to a system of a type for converting solar energy to energy in a different form, such as electric energy, and more particularly to such a system and energy conversion unit arranged and organized to increase the efficiency thereof so as to minimize cost of generation of electricity as well as cost of manufacture of the system and unit.

BACKGROUND OF THE INVENTION

Past designs for solar/electric conversion systems have typically employed pressed fresnel lenses with long focal lengths and small acceptance angles. These systems have sufficiently high costs as not to be suitable for high volume manufacture.

Pressed fresnel lenses are used because sharp edges and good surface finish is possible, but this is at the expense of using straight sided or non-undercut lens tips or facets. Long focal lengths are generally necessary with these straight vertical sided lenses in order to keep efficiency high. Some systems have used straight sided pressed lenses and then curved the lenses after manufacture in a secondary operation, in order to reduce focal length without sacrificing efficiency. Both of these approaches are costly. Also this construction employs side/lens joints which are wasted from a light collection point of view and require increased cost in surface areas.

High efficiency photovoltaic cells are normally made with grid lines on their surface. These grid lines block a substantial amount of light from reaching the photovoltaic cells therebeneath. Thus, wherever previous cells have been oriented at approximately 90 degrees to the main axis of the lens and since the grid lines thereon serve to reflect light back outside the lens to be lost, the efficiency of the system is significantly reduced.

Solar concentrating systems which must track the sun typically have a plurality of modules which are spaced substantially apart, for example, in some instances by approximately 100%, in order to avoid shadowing of one lens module from another when the sun is not directly overhead, and hence, in this type of system the space left between modules has been wasted.

The present invention discloses a photovoltaic generating system organized and arranged to be made and operated at far lower cost and substantially increased efficiency with reduced losses and increased acceptance angles. A short focal length fresnel lens and sides are extruded in one (or more) pieces and in such a way that the fourth side is made up of a heat sink which carries the photovoltaic cell thereon. The fresnel lens is shaped with a curved top surface and lower lens facets with undercut lens tips to reduce short focal length losses caused by shadowing between facets. These facets are proportioned to minimize radial losses and material. (i.e., average facet radial depth to focal length is preferably in the range of 0.8% to 3.5%).

Optical efficiency is further enhanced by utilizing the extruded side walls of the module as light pipes to carry light from the side/lens joint area via the side walls to a cell.

The extruded lens is designed with a relatively low top curvature in order to reduce material and reflective losses while the lower surface of the lens is more sharply curved than the top surface. This causes the direction of light entering to be substantially different or displaced from the angle of light leaving the lens. As disclosed herein the refraction averaged across the face of the lens runs on the order of approximately 15 degrees.

The outside edges of the fresnel lens or top edges of the side walls which are normally joints and hence areas of losses, are shaped to collect this otherwise lost light and channel it into the light pipe sides. The light passing via the side walls is directed to the photovoltaic cell by a tapered end section which is reflective on the outside surface so that the internally refracted light eventually exits the tapered section adjacent the cell.

The acceptance angle of the system is greatly increased by making the sides of the module inwardly reflective so that light entering via the fresnel lens which strikes the sides of the module and would otherwise be lost, is reflected by the sides back to the photovoltaic cell and utilized.

A secondary concentrating lens can be employed to increase the concentration ratio, giving more uniform flux distribution either as a line or a point focus, lowering the amount of cell area required and decreasing the overall cost of the entire system.

The efficiency of the system can be increased by replacing the usual single cell with two cells, each constructed with a number of spaced parallel conductors with tops of reflective material. These two cells are disposed respectively in intersecting planes. In this way, lost reflected light either from the cell or its overlying conductors is directed to a second cell and a majority of this otherwise reflected or lost light is used.

A further increase in efficiency is achieved by using two different types of cells, wherein each "type" of cell absorbs or responds to a different particular range of wavelengths of light. Thus, with one cell of silicon and the other of a material such as aluminum gallium arsenide (AlGaAs), light not used by one of the two cells is reflected to the second cell to be used by it and a higher percentage of the light spectrum is converted to electrical energy.

While applicant has referred throughout to conversion of solar energy to electrical energy it is to be understood that conversion from solar energy to energy in another form such as steam can be achieved by the same system by replacing the photovoltaic cell with a coil of tubing material supplied by a body of water.

The V cells can be made either to reflect selective wavelengths from their surface or to absorb light and reflect unused wavelengths from the reflective back surface of the cell. A still further increase in efficiency and cost effectiveness in concentrating systems has been achieved by utilizing the otherwise wasted space located between modules which space is normally present to prevent one module from shadowing the other. To reduce this loss the intermediate space between adjacent pairs of concentrators is filled with flat plate type photovoltaic cells arranged in either a V cell configuration or in a flat configuration with a clear thin cover shaped to include a plurality of v-shaped surfaces. The alternately spaced flat plates absorb the otherwise lost light not used by the concentrators, thereby increasing the efficiency of the overall system.

Thus, a general object of this invention is to provide a solar concentrator and system having substantially enhanced efficiency at lower cost.

Another object of the invention is to increase the efficiency of the flat plate collectors by either a V shaped configuration of the cells themselves or to have the cells arranged to be flat but to have a glass or plastic cover shaped in a series of V's so that surface reflections are reduced and the efficiency of the system is thereby increased.

It is yet another object of the invention to provide a linear concentrating collector of low concentration in which light is simultaneously directed to the top and underside of the cell. A substantial increase in concentration is then possible without reducing acceptance angles. This collector can have acceptance angles of plus or minus 25 degrees by plus or minus 90 degrees and hence will not need to track the sun, becoming far less expensive and more reliable.

An additional object of the invention is to provide a heat sink formed to support the cell from beneath while leaving a large portion of the underside of the cell exposed to sunlight.

A further object of the invention is to provide a short focal length fresnel lens.

Another object of the invention is to provide a unitary extruded body comprising a fresnel lens and a pair of side walls depending therefrom.

Yet a further object of the invention is to provide a totally internally reflecting secondary lens.

Yet an additional object of the invention is to provide a module with internally reflecting sides thereby forming a wide acceptance angle to the unit.

A further object of the invention is to provide a solar concentrator which operates with single axis tracking of the sun and provides a relatively wide tolerance at low cost.

Yet a further and additional object of the invention is to provide a staked or snap-on heat sink secured to said body to form a closure of the module between the spaced edge margins of the side walls.

An additional object of the invention is to make a large system to operate relatively inexpensively even with large tracking errors.

Yet a further object of the invention is to provide light conductive side walls to a unit of the kind described.

An additional object of the invention is to make a fresnel lens with undercut facets, in order to obtain a short focal length.

Yet another object of the invention is to provide a system and unit with selective wavelength reflection capability so as to absorb more of the light which strikes one or the other of the two cells of a V-cell element.

The foregoing and other objects of the invention will become more readily evident from the following detailed description of preferred embodiments when considered in conjunction with the drawings, in which:

BRIEF DESCRIPTION OF THE DRAWINGS

FIG. 1 shows a diagrammatic perspective view of an energy conversion unit or module;

FIG. 2 shows a transverse cross section of FIG. 1;

FIG. 3 shows an enlarged detail view of part of FIG. 2 with the secondary lens removed to form an additional embodiment of the invention;

FIG. 4 shows an enlarged diagrammatic detail view of FIG. 1 showing paths of light rays being refracted by a fresnel lens, reflected by the side walls, refracted and internally reflected by a secondary lens;

FIG. 5 shows a further enlarged diagrammatic detail view of the secondary concentrator lens shown in FIG. 4;

FIG. 6 shows an enlarged diagrammatic detail view as shown in FIG. 4 with the lens having a 5 degree tracking error;

FIG. 7 shows a further enlarged diagrammatic detail view of the secondary concentrator lens of FIG. 6;

FIG. 8 shows an enlarged corner detail of a lens/wall connection according to the prior art;

FIG. 11 shows an end elevation view partially in section of a single axis tracking system according to a preferred embodiment of the invention;

FIG. 11A shows a side elevation view partially in section showing the system embodiment of FIG. 11;

FIG. 12 shows a back elevation view of the system embodiment shown in FIGS. 11, 11A;

FIG. 12A shows a diagrammatic side elevation view of the system shown in FIG. 12 taken along line 12A—12A thereof;

FIG. 13 shows an enlarged diagrammatic detailed view showing light loss using a flat, horizontal cell;

FIG. 14 shows an enlarged diagrammatic detail view of a V cell construction capturing more light than the flat cell in FIG. 13;

FIGS. 15 and 16 show enlarged diagrammatic plan views of photovoltaic cell surfaces with conductive reflective traces disposed thereon;

FIG. 17 shows a diagrammatic perspective V-cell made from a pair of cells as shown in FIG. 15;

FIG. 18 shows a diagrammatic end view partially in section according to another embodiment of the invention;

FIG. 19 shows a diagrammatic perspective view according to yet a further embodiment of the invention featuring means for directing light to the underside of a photovoltaic cell;

FIG. 20 shows a diagrammatic enlarged detail perspective view of a portion of FIG. 19;

FIG. 21 shows a diagrammatic transverse section view of a pair of cells according to another embodiment of the invention intended to remain stationary;

FIG. 22 shows a diagrammatic end elevation section view of a V cell formed to utilize a greater proportion of light directed onto a pair of cells of differing materials;

FIG. 23 shows a diagrammatic end elevation section view of a modular unit according to another embodiment of the invention;

FIG. 24 shows an enlarged lower end of FIG. 23; and

FIG. 25 shows a diagrammatic end section view according to yet a further embodiment of the invention.

FIG. 26 shows a side elevation view of secondary concentrators providing a point focus as shown in FIG. 27; and FIG. 27 shows a diagrammatic transverse section view of a module according to another embodiment of the invention characterized by secondary concentrators for achieving a so-called point focus.

DETAILED DESCRIPTION OF PREFERRED EMBODIMENTS

Figure 9:
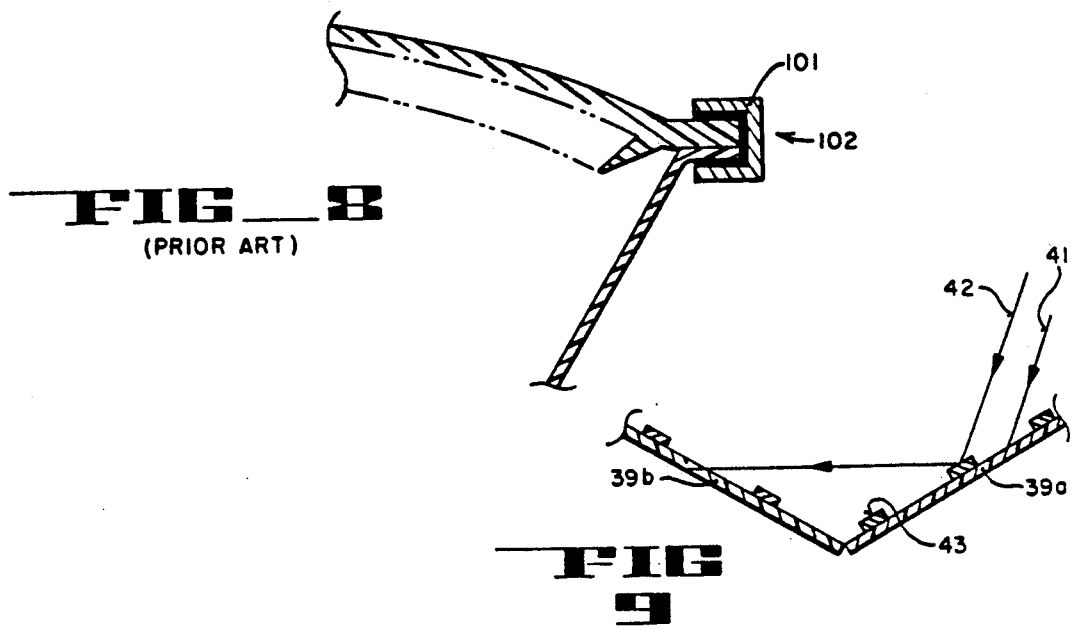
FIG. 9 shows an enlarged diagrammatic view in transverse section of a V-cell, according to the invention.

FIG. 1 shows a typical solar energy conversion module assembly or unit 20 for converting sunlight to electrical energy. As explained further below, unit 20 is primarily for use in a solar energy system of a type serving to convert solar energy to a different form of energy, such as electrical energy, and comprises an elongate extruded unitary body 21 including an arcuate elongate fresnel lens, 22. The outer surface of lens 22 is smooth while the inner surface thereof is formed with a number of facets 22a.

Sidewalls 23 depend from the side edges 25 of lens 22 and angle toward each other as shown best in FIG. 2. The sidewalls 23 carry means, such as a reflective layer 24 of material such as made and sold under the trademark "Mylar" of the Dupont Corporation. This material can be applied to either the outside or inside surface of the walls 23, the only objective being merely to reflect light inwardly of unit 20.

Thus, the reflective sidewalls 24 depend from the side edges 25 of lens 22 and are angled toward each other. The free edges 26 of sidewalls 23 are spaced apart to form an open side to unit 20 opposite lens 22.

Thus, as shown in FIGS. 4, 5, 6 and 7 the effect or benefit derived from the use of internally reflecting sidewalls 23 will be clearly explained further below.

With a tracking error of zero degrees, light which is gathered in by the outer edges of lens 22 will be refracted back to the interior of the unit to focal point 19 below cell 29, so as to strike the secondary concentrator 32. Accordingly, the light rays 34 are deflected by means of the reflective side wall 23 whereas rays 36 are also deflected by means of a reflective side wall at 37 alongside the secondary concentrator 32, all by total internal reflection with secondary 32. Accordingly, by providing reflective side walls more of the sunlight falling upon lens 22 will reach photovoltaic cell 29 located at the bottom of unit 20. This, accordingly, substantially increases the angle of acceptance of lens 22. The foregoing description pertains to a situation where there is no error in tracking the sun. However, in FIGS. 6 and 7 a tracking error of 5 degrees has been represented and this, of course, is where the wide acceptance angle of the lens assembly 22 becomes significantly important. Note for example in FIG. 7 where the left side reflective wall serves to redirect many of the beams of light onto the region 29a of photovoltaic cell region 29A. Accordingly, it is clear that a substantial tracking error can occur using equipment of the kind described without significant loss of sunlight.

As shown in FIG. 3, the secondary concentrator 32 has been removed to provide another embodiment at lesser cost and with somewhat lesser performance.

As shown in FIG. 25 the space defined between adjacent pairs of modular units 51 includes elongate flat photovoltaic cells 59 which will receive sunlight 62 as it passes through an elongate clear plastic or glass cover 61. Cover 61 can be flat and spaced parallel to cell 59, but preferably shaped to include a series of parallel spaced V-shaped surfaces 61a so that surface reflections are reduced and the efficiency of the system correspondingly increased. V cells 39 can similarly be interposed between adjacent pairs of elongate modular units 51 as shown in FIG. 18.

Thus, in FIG. 18 the sunlight 62 is shown as being directed downwardly at its vertical position onto a V cell 39 as previously described.

V cells 39 are disposed in parallel relation between adjacent pairs of elongate modular units 51 so as to increase the efficiency of this system without substantial increase in cost.

Thus, as shown in FIG. 18 the modular units 51 are carried between a pair of side channels 63 of rigid material with simulated light rays 62, 64 shown in phantom lines. Accordingly, it will be evident that as the sun moves across the array of modular units 51, the sun will eventually be directing sunlight substantially normal to the array. The sun will however continue to move across the sky and the sunlight will take a path defined by light rays 64 which will remain substantially directly applied to modular units 51 by virtue of the fact that a suitable clock operated driving means 58 will be moving all of the units 51 simultaneously so that they will be following the sun without need to be tracked in a north south direction. Thus, the increase in angle of acceptance of lens 22 as arranged herein provides a substantial economy in not requiring highly accurate tracking in two mutually perpendicular directions.

Shown in FIGS. 19-21, stationary modules of the kind generally described serve to gather sufficient light to be entirely satisfactory while substantially free of any tracking. Accordingly, as shown in FIG. 19, a pair of modular units 66, 67 each include fresnel lenses 68 as described above and reflective side walls 71 serving to reflect sunlight back inwardly of units 66, 67 as well as outwardly toward reflector 73.

Each unit 66, 67 includes a V-cell energy converting unit 72 having means supporting the energy converting unit 72 to expose both the top and bottom thereof to sunlight simultaneously. Accordingly, by using means serving to direct sunlight onto the bottom of unit 72 contemporaneously with the directing of sunlight onto the top of the energy converting unit 72, the modular units 66, 67 serve to generate more energy at a given orientation.

Thus, between the two modular units 66, 67 in the space therebetween there is disposed an inverted V-shaped reflector 73. In addition, the energy converting portion of V cell 72 has been supported by comb means 74 formed from heat sink 77 whereby large portions of the energy converting cell 72 are exposed from beneath. Accordingly, by providing the mirrors 71a, 73 between units 66, 67 it is possible to direct sunlight to both the topside and the bottom side of the energy converting V cells 72 simultaneously, notwithstanding the oblique direction of the sun's rays, e.g. 75.

Means for maintaining units 66, 67 in substantially parallel relation in a stationary array comprises the pair of panels 76 and 77 formed as a heat sink integrally with comb 74.

Accordingly, by being able to direct sunlight against opposite surfaces of the V cell 72 substantial efficiency in converting sunlight to electrical energy is achieved.

Yet another embodiment, as shown in FIG. 21 includes a stationary array provided by extruding the side walls 78 and lenses 79 and then closing the opening opposite lenses 79 by means of a V cell 81 secured to the bottom edge margin of sidewalls 78 by means of a snap fitting 82.

In addition, a reinforcing panel 83 extends between the bottom edge margins of walls 78 to provide a semi-rigid array structure.

As shown in FIG. 21, modular units of the kind described serve to receive sunlight over an angle of plus or minus 25 degrees while remaining stationary. This, of course, eliminates all of the expense of the tracking means otherwise involved.

A means for enhancing the efficiency of the P.V. cells is to arrange them in a V configuration as shown in FIGS. 9 and 24. In a standard cell arrangement shown in FIG. 16, light rays 84, FIG. 13, striking the traces 50 are entirely lost and 4% of the light striking the cell between the traces is also reflected and lost. Further, connecting strip 46 is totally out of the light path as in FIG. 13 and hence wasted.

In FIG. 15, the normal conductive solder strip 46 of FIG. 16 is replaced by solder tabs 44 and conductors 60, FIG. 17. Traces 45 in FIG. 15 and conductive tabs 60 in FIG. 17 are both made to be reflective, and since they are also formed in a v configuration as in FIG. 17, light 84, FIG. 14, striking the reflective traces 45 or tabs 60 will be reflected across to the opposite cell and only a small percentage lost. Also, light striking the cell itself between traces which is reflected and normally lost, as in FIG. 13, will be mostly absorbed, even if no anti-reflective (AR) coating is used; and since all of cell 35, FIG. 14, is in the light path, cell size can be, and has been, reduced.

A further increase in efficiency of the V cell can be obtained as in FIG. 22 where one cell is for example, Aluminum Galium Arsenide 87, and the other Silicon 86.

Aluminum Galium Arsenide (AlGaAs) has an electron band gap of approximately 1.8 electron volts (e.v.) while silicon has approximately 1.2 e.v.. If each V cell is coated with a selective AR coating so that the AlGaAs cell reflects light of wavelengths below 1.8 e.v. and if the silicon cell is coated so that wavelengths above 1.2 e.v. are reflected, then light 84 which is not used by the AlGaAs cell 87 will be used by the silicon 86 and light 84 not used by the silicon cell 86 will be reflected across and be used by the AlGaAs as in 87. In this way extra light is absorbed and more energy is generated.

Another embodiment of the V cell arrangement of FIG. 22 would be to have the AlGaAs cell 87 replaced by a cell of a type such as is shown at 91 of FIG. 24 wherein light which is not absorbed by 91 is reflected by the back of the cell 91 onto the opposing V cell 97.

Another variation of the V cell is shown in FIGS. 23 and 24. In this configuration cells 91 are arranged and organized to accept almost all light. Cell 91 has been manufactured of aluminum gallium arsenide with a low doped substrate with a reflective backing 92 as well as reflective traces 93. Light 96 falling on the area of the cell between the traces 93 which is of a lower wavelength and not used or consumed by the cell is reflected as at 94 by the back 92 onto another cell 97, for example, of silicon to be used.

Another embodiment is shown in FIG. 27. Moulded lenses form a secondary lens 98 which enhances the effects described above and shown in FIGS. 23 and 24 by forcing rays 96 to be more constant and vertical in strking cell 99.

The moulded secondary lenses 98 are formed to also concentrate the light in the axial direction shown in FIGS. 26, 27 so that a so-called "point focus" is achieved giving higher concentrations, improved efficiency, and lower cell costs.

Normally lenses and sides are joined by projections and joining pieces such as the retainer 101, as shown in FIG. 8, which results in these jointed regions 102 being lost, with material and labor being wasted.

Figure 10:
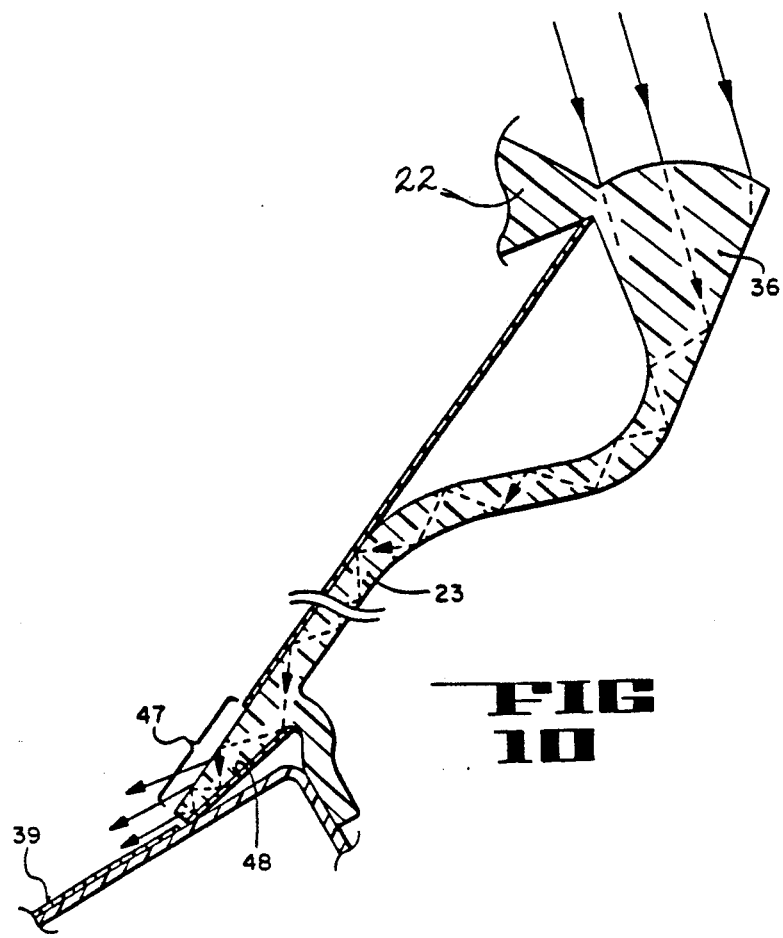
FIG. 10 shows an enlarged view of another embodiment showing the reflected light path through the side wall.

In a preferred embodiment shown in FIG. 10, the joined region 102, FIG. 8, is replaced by a tapered light collector 36. Collector 36 is an integral part of extruded lens 22 and side 23.

Light collected by tapered collector 36 is directed down sidewalls 23 which act as light pipes, conducting light by internal reflection to a tapered portion 47 which has an outside reflection area 48 causing the light carried by the light pipe 23 to be directed from portion 47 so as to be collected by cells 39.

From the foregoing it should be readily evident that there has been provided an improved system for converting solar energy to energy in a different form. In the present instance the different form of energy is electrical energy and it is also evident that the solar energy received can be used if desired to provide steam by heating a heating coil containing vapors or the like located in the region of the solar electric conversion cell.

What is claimed:

1. For use in a solar energy system of a type serving to convert solar energy to a different form of energy; an energy converting unit comprising an elongate extruded unitary body including an arcuate, elongate fresnel lens, side walls integral to and depending from the side edges of said fresnel lens and angled toward each other, the free edges of said side walls being spaced apart to form an open side to said unit opposite said fresnel lens; an elongate heat sink means carried by said free edges to form a closure to the open side opposite said fresnel lens; and energy converting means carried by said heat sink means and responsive to receipt of solar energy thereon for generating energy in a different form.

2. In an energy converting unit according to claim 1, further including a totally internally reflective secondary concentrator lens disposed to fill said open side of said unit between said free edges for directing and concentrating solar energy onto said energy converting means.

3. The invention according to claim 1 wherein said energy converting means including a pair of photovoltaic cells disposed to lie in intercepting planes to form a V cell.

4. For use in a solar energy system of a type serving to convert solar energy to a different from of energy; an energy converting unit comprising an elongate extruded unitary body including an arcuate, elongate fresnel lens, reflective side walls integral to and depending from the side edges of said fresnel lens and angled toward each other, the free edges of said side walls being spaced apart to form an open side to said unit opposite said fresnel lens; and elongate heat sink means carried by said free edges to form a closure to the open side opposite said fresnel lens; and energy converting means carried by said heat sink means and responsive to receipt of solar energy thereon for generating energy in a different form, said energy converting means including a pair of photovoltaic cells disposed to lie in intercepting planes to form a V cell, the confronting surfaces of the open end of said V being the active surfaces of said converting means and facing said lens one of said pair of photovoltaic cells responds to part of the wavelength of light striking same and reflects the remaining wavelength onto the other one of said pair of photovoltaic cells.

5. The invention according to claim 1 in which the focal point of said lens lies substantially at the intersection of the planes of said side walls.

6. The invention according to claim 1 in which the inner surfaces of said side walls are reflective so as to reflect solar rays onto said energy converting means whenever said lens is misdirected with respect to a light source.

7. The invention as in claim 6 further in which said energy conversion means lies in each of a pair of planar members disposed to form a V shaped end view.

8. For use in a solar energy system of a type serving to convert solar energy to a different form of energy; an energy converting unit comprising an elongate extruded unitary body including an arcuate, elongate fresnel lens, the outer surface of said lens being smooth and the inner surface being formed with a number of facets thereon; reflective side walls depending from the side edges of said fresnel lens and angled toward each other, the free ends of said side walls being spaced apart to form an open side to said unit opposite said fresnel lens; an elongate heat sink means carried by said free edges to form a closure to the open side opposite said fresnel lens; and energy converting means carried by said heat sink means and responsive to receipt of solar energy thereon for generating energy in the different form said side walls include a plurality of light concentrators and light pipe means therein originating adjacent the side edges of said fresnel lens, said side wall light pipe means serving to direct light therethrough to be discharged onto said photovoltaic cells.

9. The invention according to claim 8 in which the bottom inner edge margin is transparent discharging light therethrough, and the bottom outer edge margin lies at an angle converging with respect to the bottom inner edge margin and means forming a reflective surface on the bottom outer edge margin serving to direct light from within the side wall onto said photovoltaic cell.

10. A solar energy system of a type serving to convert solar energy to a different form of energy comprising a plurality of elongate energy converting units disposed to form an array thereof and disposed to lie in a plane; each said unit being supported on an associated axis to be tipped between advanced and retracted positions; means coupled to each said unit for moving said units conjointly between said positions at a rate correspondaing to the rate of movement of the sun thereacross.

11. A solar energy system as in claim 10 wherein said units are spaced laterally apart sufficiently to accommodate said movements between advanced and retracted positions thereby leaving predetermined open spacing therebetween, a supplementary energy converting unit carried in said spacings, said supplementary energy converting units comprising elongate photo-voltaic cell means lying in said spacing.

12. The invention according to claim 11 in which said supplementary unit comprises a pair of photovoltaic cells disposed to lie in intercepting planes to form a V shaped cell therebetween.

13. For use in a solar energy system of a type serving to convert solar energy to a different form of energy; an energy converting unit comprising an elongate extruded unitary body including an arcuate, elongate fresnel lens, the outer surface of said lens being smooth and the inner surface being formed with a number of facets thereon; reflective side walls depending from the side edges of said fresnel lens and angled toward each other, the free edges of said side walls being spaced apart to form anopen side to said unit opposite said fresnel lens; an elongate heat sink means carried by said free edges to form a closure to the open side opposite said fresnel lens; and energy converting means carried by said heat sink means and responsive to receipt of solar energy thereon for generating energy in the different form wherein said energy converting means comprises a pair of photovoltaic cells disposed to lie in intercepting planes to form a V cell means supporting said energy converting cell to expose both the top and bottom thereof to sunlight, and means serving to direct sunlight onto said bottom contemporaneously with the direction of sunlight onto the top of said energy converting means so as to generate more energy at a given position.

14. For use in a solar energy system of a type serving to convert solar energy to a different form of energy; an energy converting unit comprising an elongate extruded unitary body having an arcuate elongate fresnel lens, the outer surface of said lens being smooth; reflective side walls depending from the side edges of said lens and angled toward each other to form an open side to said body opposite said fresnel lens; means for closing said open side comprising an elongate panel forming a heat sink secured to the bottom edges of said side walls; and photovoltaic cell means for converting solar energy to energy in a different form, said cell means being carried by said panel.

15. The invention according to claim 14 in which said panel is formed along the side edges thereof to engage the edge margins of the sides of said body to retain said panel thereto.

16. For use in a solar/electric system as energy converting means serving to convert solar energy to electrical energy comprising first and second photovoltaic cells, each cell carrying a plurality of spaced parallel reflective traces extending thereacross; said reflective traces forming operative active portions of said energy converting means, said photovoltaic cells lying in intersecting planes respectively to form a V-cell therefrom in order to reflect unused light from one cell to the other.

17. For use in a solar/electric system an energy converting means serving to convert solar to electric energy comprising an elongate flat photovoltaic cell and a clear cover overlying same in closely spaced relation; said clear cover being formed to include a series of elongate parallel spaced V-shaped surfaces lying substantially in a plane and serving to reduce surface reflections and thereby to enhance the efficiency of said cell.

18. In a system for converting solar energy into electricity, a module comprising an extruded linear fresnel lens carrying at the sides thereof extruded side walls, a heat sink extending between said side walls at a position remote from said lens, and a photovoltaic cell carried by said heat sink.

19. A system as in claim 18 in which said side walls are reflective to reflect light inwardly of said module.

20. A system as in claim 18 in which said fresnel lens has a short focal length.

21. A system as in claim 18 in which said lens has a short focal length and said side walls are reflective to direct light from said lens inwardly of said module.

22. In a system according to claim 18 in which said lens comprises a short focus fresnel lens in which the focal point is disposed on the remote side of said cell with respect to said lens.

23. In a system according to claim 18 in which said lens and side walls are integrally extruded together.

24. In a system according to claim 18 in which said heat sink snaps together with said side walls to form a closure therebetween.

25. In a system according to claim 18 further including a secondary lens carried between the lower edge margins of said side walls for further concentrating said solar energy onto said cell.

26. In a system as in claim 25 in which said secondary lens has been formed as an extruded portion of one of said side walls.

27. In a system according to claim 26 wherein said side walls function as light pipes for carrying light collected by said region to said cell.

28. In a system as in claim 15 comprising a plurality of said units in which said side walls carry reflective material on both the inner and outer sides thereof, and an inverted V shaped reflector disposed between adjacent pairs of said units, the side walls of said units confronting said reflector serving to reflect light received at an oblique angle and to redirect such light onto the underside of said cell via said reflector, said heat sink having open portions thereto exposing the underside of said cell to light reflected onto it.

29. In a system for converting solar energy into electricity comprising a photovoltaic cell, an elongate lens and side walls depending therefrom, said walls and lens being extruded together to form an integral joint therebetween, said joint forming a light collecting region.

30. In a system for converting solar energy to electricity an improved photovoltaic cell assembly comprising a pair of photovoltaic cells disposed adjacent each other, said cells lying respectively in intersecting planes to form a V shape cell assembly, the front surfaces of said V shaped cell carrying active elements thereof for converting solar energy to electrical energy.

31. In a system according to claim 30 in which said pair of cells each carries conductive reflective traces thereon exposed to light, said traces forming active portions of each said cell.

32. In a system according to claim 31 in which said reflective conductive traces of said pair of cells are respectively disposed to be angled in opposite directions.

33. In a system according to claim 30 in which at least one of said pair of cells carries a reflective backing, the reflective surface of said backing facing the back surface of said cell.

34. In a fresnel lens system wherein the average radial depth of the facets to the focal length of said lens as a percentage thereof lies substantially in the range between 0.8 to 3.5 percent.

35. In a photovoltaic solar cell comprising plural V cell means; reflective trace means carried by said V cell means and angled with respect to each other to form intersecting planes, said trace means serving to form active portions of said cell, and reflective conductive connections disposed and arranged to locate substantially all said V cell mens to be exposed to light.

36. In a photovoltaic solar generating system an array comprising fixed modules and movable modules, said movable modules being disposed to track the sun in a given direction, said movable and fixed modules being disposed alternately across said array.

* * * * *